United States Patent
Ramm et al.

(10) Patent No.: US 10,178,805 B2
(45) Date of Patent: Jan. 8, 2019

(54) HEATSINK WITH INTERNAL CAVITY FOR LIQUID COOLING

(71) Applicant: Tesla Motors, Inc., Palo Alto, CA (US)

(72) Inventors: Robert James Ramm, Mountain View, CA (US); Wenjun Liu, Santa Clara, CA (US); Colin Campbell, San Francisco, CA (US)

(73) Assignee: Tesla, Inc., Palo Alto, CA (US)

( * ) Notice: Subject to any disclaimer, the term of this patent is extended or adjusted under 35 U.S.C. 154(b) by 339 days.

(21) Appl. No.: 14/286,670

(22) Filed: May 23, 2014

(65) Prior Publication Data
US 2015/0342092 A1 Nov. 26, 2015

(51) Int. Cl.
| | | |
|---|---|---|
| F28F 7/00 | (2006.01) | |
| F28D 15/00 | (2006.01) | |
| F28F 3/14 | (2006.01) | |
| H05K 7/20 | (2006.01) | |
| H01L 23/34 | (2006.01) | |

(Continued)

(52) U.S. Cl.
CPC .......... *H05K 7/20436* (2013.01); *B23P 15/26* (2013.01); *F28F 3/022* (2013.01); *F28F 3/044* (2013.01); *F28F 3/046* (2013.01); *F28F 3/048* (2013.01); *F28F 3/12* (2013.01); *H01L 23/4093* (2013.01); *H01L 23/473* (2013.01); *H05K 7/20263* (2013.01); *H05K 7/20872* (2013.01); *F28D 2021/0077* (2013.01); *F28F 2275/08* (2013.01); *H01L 2924/0002* (2013.01); *Y10T 29/49352* (2015.01)

(58) Field of Classification Search
CPC . H05K 7/20436; H05K 7/20254; F28F 3/022; F28F 3/04

USPC .......... 165/80.4, 170, 104.19; 361/699–700, 361/689; 257/718, 719
See application file for complete search history.

(56) References Cited

U.S. PATENT DOCUMENTS 3,524,497 A * 8/1970 Chu ...................... H01L 23/473
165/104.33
4,872,089 A * 10/1989 Ocken ................. H01L 23/4093
174/16.3

(Continued)

FOREIGN PATENT DOCUMENTS

| CN | 102034771 | 4/2011 |
| CN | 102563998 | 7/2012 |

(Continued)

OTHER PUBLICATIONS

Translation of Chinese Patent Document CN 102563998 A—entitled Translation-CN 102563998 A.*

(Continued)

*Primary Examiner* — Len Tran
*Assistant Examiner* — Paul Alvare
(74) *Attorney, Agent, or Firm* — Bruce E. Garlick; Garlick & Markison

(57) ABSTRACT

A heatsink with an internal cavity for liquid cooling includes: a first part having a first group of fins extending into the internal cavity; a second part attached to the first part so that the internal cavity is formed, the second part having a second group of fins that extend into the internal cavity and that are configured to fit among the first group of fins; an inlet into the internal cavity on at least one of the first and second parts; and an outlet from the internal cavity on at least one of the first and second parts.

16 Claims, 5 Drawing Sheets

(51) Int. Cl.
*B23P 15/26* (2006.01)
*H01L 23/40* (2006.01)
*H01L 23/473* (2006.01)
*F28F 3/02* (2006.01)
*F28F 3/04* (2006.01)
*F28F 3/12* (2006.01)
*F28D 21/00* (2006.01)

(56) References Cited

U.S. PATENT DOCUMENTS

| | | | | |
|---|---|---|---|---|
| 5,400,854 A * | 3/1995 | Iio | .......................... | F28D 9/0043 |
| | | | | 165/157 |
| 6,039,114 A * | 3/2000 | Becker | .................. | F28D 9/0031 |
| | | | | 165/146 |
| 6,144,092 A * | 11/2000 | Kappes | ............... | H01L 23/4093 |
| | | | | 257/712 |
| 6,283,778 B1 | 9/2001 | Kupnicki et al. | | |
| 6,508,301 B2 * | 1/2003 | Marsala | ................. | F25B 39/022 |
| | | | | 165/104.33 |
| 6,882,041 B1 | 4/2005 | Cheah et al. | | |
| 7,149,086 B2 * | 12/2006 | Faneuf | .................. | H01L 23/427 |
| | | | | 165/104.33 |
| 7,173,823 B1 * | 2/2007 | Rinehart | ............... | F28D 9/0031 |
| | | | | 165/80.4 |
| 7,855,888 B2 * | 12/2010 | Peterson | ............. | F28D 15/0275 |
| | | | | 165/104.33 |
| 7,977,821 B2 | 7/2011 | Kojori et al. | | |
| 8,081,462 B2 * | 12/2011 | Balcerak | ................. | H01F 27/10 |
| | | | | 165/104.33 |
| 2005/0133210 A1 * | 6/2005 | Inagaki | ................. | F28D 1/0333 |
| | | | | 165/152 |
| 2006/0231236 A1 * | 10/2006 | Spokoiny | ........... | H05K 7/20254 |
| | | | | 165/80.4 |
| 2007/0263361 A1 * | 11/2007 | Lai | ..................... | H01L 23/4093 |
| | | | | 361/719 |
| 2009/0114372 A1 * | 5/2009 | Ippoushi | ................. | F28F 3/022 |
| | | | | 165/104.14 |
| 2010/0136404 A1 | 6/2010 | Hermann et al. | | |
| 2011/0067841 A1 * | 3/2011 | Doo | ................... | H05K 7/20254 |
| | | | | 165/104.19 |
| 2012/0201036 A1 | 8/2012 | Hsu | | |
| 2012/0305283 A1 | 12/2012 | Kalayjian et al. | | |
| 2013/0044434 A1 * | 2/2013 | Sharaf | ................ | H05K 7/20927 |
| | | | | 361/702 |
| 2014/0090809 A1 * | 4/2014 | Mori | ......................... | F28F 3/02 |
| | | | | 165/104.19 |
| 2014/0091453 A1 * | 4/2014 | Mori | ..................... | H01L 23/473 |
| | | | | 257/712 |

FOREIGN PATENT DOCUMENTS

| | | | | |
|---|---|---|---|---|
| CN | 102563998 A * | 7/2012 | ............. | F28F 3/022 |
| CN | 202452775 U | 9/2012 | | |
| DE | 19600164 A1 | 7/1997 | | |
| DE | 10315225 A1 | 10/2004 | | |
| DE | 102011118483 A1 * | 5/2013 | ........... | H01L 23/473 |
| EP | 2175221 A2 | 4/2010 | | |
| JP | 9214161 | 8/1997 | | |
| JP | 2000506966 | 6/2000 | | |
| JP | 2002543598 | 12/2002 | | |
| JP | 2005302898 | 10/2005 | | |
| JP | 2013542604 | 11/2013 | | |
| JP | 2014072395 | 4/2014 | | |
| WO | WO 9737187 A1 * | 10/1997 | ............. | F28F 3/048 |
| WO | WO 2013097146 | 7/2013 | | |

OTHER PUBLICATIONS

Translation of German Patent Document DE 102011118483 A1 entitled Translation-DE 102011118483 A1.*
International search report in application PCT/US2015/031396, dated Sep. 6, 2015, 12 pages.
European Patent Office; Extended European Patent Office; EP Application No. 15795793.7; dated Jan. 3, 2018; 6 pgs.

* cited by examiner

HEATSINK WITH INTERNAL CAVITY FOR LIQUID COOLING

BACKGROUND

Some electric and electronic components require some form of cooling during use. In certain scenarios, active cooling is provided by bringing a stream of air or a flow of liquid (i.e., coolant) into thermal contact with the heat-generating device(s). Heat is absorbed by the air/coolant as it passes by the heated region, and thermal energy is then dissipated from the cooling medium in some way, such as using a radiator.

In liquid-cooling systems, the coolant is usually circulated through one or more conduits that are designed to absorb the generated heat and transfer it to the medium flowing inside. Some such conduits have internal structures designed to improve the heat transfer into the coolant. However, manufacturing such conduits with internal structures can be challenging.

SUMMARY

In a first aspect, a heatsink with an internal cavity for liquid cooling includes: a first part having a first group of fins extending into the internal cavity; a second part attached to the first part so that the internal cavity is formed, the second part having a second group of fins that extend into the internal cavity and that are configured to fit among the first group of fins; an inlet into the internal cavity on at least one of the first and second parts; and an outlet from the internal cavity on at least one of the first and second parts.

Implementations can include any or all of the following features. The first group of fins comprise first pins arranged in a first array, and wherein the second group of fins comprise second pins arranged in a second array. The first array has rows that are staggered from rows in the second array, and wherein the first array has columns that are staggered from columns in the second array. One of the columns in the first array has N complete pins and wherein a corresponding column in the second array has N−1 complete pins and two half-pins, the two half-pins located above and below, respectively, the N−1 complete pins. The first part has the internal cavity, and wherein the second part is a substantially flat lid that closes the internal cavity when the second part is attached to the first part. The inlet and the outlet are located on the first part. The inlet makes a turn before reaching the internal cavity and wherein the heatsink has a fin at the turn. The outlet makes a turn after the internal cavity and wherein the heatsink has a fin at the turn. The heatsink comprises a housing formed by the first and second parts that is substantially flat, the heatsink further comprising a tab on an edge of the housing, the tab configured for positioning springs on the housing for holding electric components. Each spring comprises a clip configured for holding a pair of electric components, one on each side of the housing. The first group of fins is oppositely oriented than the second group of pins. The first group of fins and the second group of fins fully overlap each other. The first and second groups of fins have identical shapes. The fins are pins and the identical shapes comprise oval profiles. Each of the first and second groups of fins are pins, and wherein each of the pins has a draft. The inlet is configured for connection to a first manifold having at least another heatsink attached, wherein the outlet is configured for connection to a second manifold that also has at least the other heatsink attached, and wherein the first and second manifolds provide parallel flows of coolant through the heatsink and the other heatsink. The first and second parts consist of respective first and second cast parts. The first and second parts are made of aluminum.

In a second aspect, a method of manufacturing a heatsink with an internal cavity for liquid cooling includes: casting a first part having a first group of fins extending into the internal cavity; casting a second part configured to be attached to the first part so that the internal cavity is formed, the second part having a second group of fins that extend into the internal cavity and that are configured to fit among the first group of fins, wherein an inlet into the internal cavity is located on at least one of the first and second parts, and wherein an outlet from the internal cavity on at least one of the first and second parts; and attaching the second part to the first part.

Implementations can include any or all of the following features. The first group of fins comprise first pins arranged in a first array, wherein the second group of fins comprise second pins arranged in a second array, wherein the first array has rows that are staggered from rows in the second array, wherein the first array has columns that are staggered from columns in the second array. One of the columns in the first array has N complete pins and wherein a corresponding column in the second array has N−1 complete pins and two half-pins, the two half-pins located above and below, respectively, the N−1 complete pins. The first and second parts are cast from aluminum.

DETAILED DESCRIPTION

This document describes examples of systems and techniques for effectively cooling electric or electronic components using a heatsink. A process of manufacturing a heatsink so that it has an advantageous internal pattern of fins is also described. For example, one or more heatsinks can be installed in an electric vehicle to remove heat from components of the electric powertrain.

Figure 1:
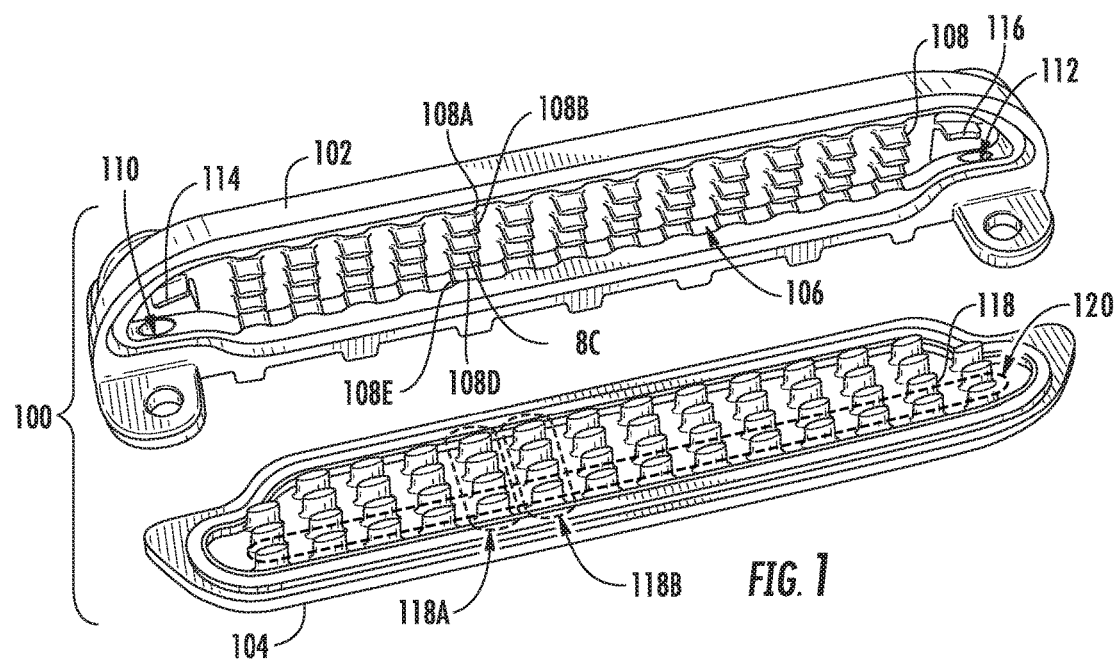
FIG. 1 shows an example of a heatsink that includes a body and a lid.

FIG. 1 shows an example of a heatsink 100 that includes a body 102 and a lid 104. The body has a hollow portion 106 that has a number of fins configured to facilitate flow of coolant, here fins 108. The fins are arranged in a regular pattern (e.g., an array), here in rows of fins, where each fin is also part of a corresponding column of fins. For example, a particular column has intermediate fins 108B, C and D, and corresponding half-fins 108A and 108E on top of, and below, the column, respectively.

The body 102 also has an inlet 110 and an outlet 112. The inlet and outlet provide fluid access to an internal cavity that is formed by the hollow portion 106 when the lid 104 is attached to the body. The location of the inlet and outlet in this example are illustrative only, and in other implementations, the inlet and/or the outlet can be in a different location. As another example, the heatsink can have more than one inlet and/or outlet. Each of the inlet and outlet has a corresponding fin 114 or 116.

The lid 104 has fins 118 that are configured to fit among the fins 108 of the body 102. Similar to the fins of the body, the fins of the lid are arranged in a regular pattern (e.g., an array), here in rows of fins (e.g. including row of fins 120), where each fin is also part of a corresponding column of fins. Unlike the body fins, however, the lid fins have no half-fins in this example. Rather, a first column 118A of the fins 118 is configured to fit on one side of the fins 108A-E when the heatsink is assembled, and another column 118B is configured to fit on the other side of the fins 108A-E. That is, the fin rows on the body are here staggered from the fin rows on the lid, and the fin columns on the body are here staggered from the fin columns on the lid.

In other implementations, the hollow portion 106 can be distributed between multiple components. For example, each of two body portions can have a respective half of the hollow portion, so as to form the internal cavity when assembled. Also, the numbers of fins in this example are illustrative only, and in other implementations, the heatsink can have different numbers of fins and/or half-fins. As another example, the columns that have half-fins can instead be on the lid, or can be distributed between the body and the lid.

Figure 2:
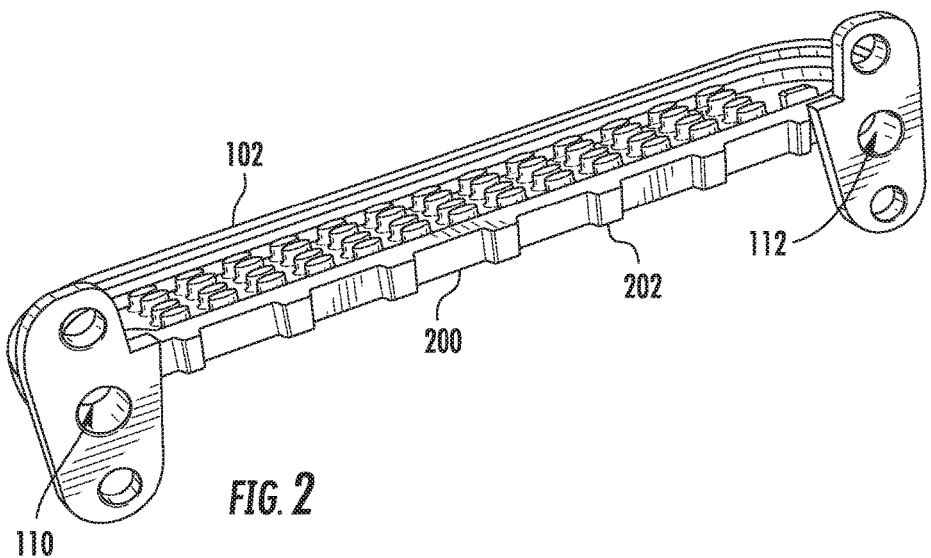
FIG. 2 shows an example of the body from FIG. 1.

FIG. 2 shows an example of the body 102 from FIG. 1. This view shows an example of the inlet 110 and the outlet 112, each providing access to the internal cavity from the base surface of the heatsink. With reference again to FIG. 1, the inlet 110 makes a turn before reaching the internal cavity. Similarly, at the outlet end, the outlet 112 makes a turn before it exits at the base surface. The fins 114, 116 are positioned at the respective turn.

The body 102 has a shape such that the heatsink will be substantially flat when assembled (e.g., after the lid is attached). Particularly, the flat body has an edge 200 that in this example is facing the same direction as the inlet and outlet. On the edge, the heatsink has one or more tabs 202 (here, seven tabs). The tabs can be used for positioning, such as to position the heatsink itself or a component attached to it (e.g., by way of a clip or spring).

Figure 3:
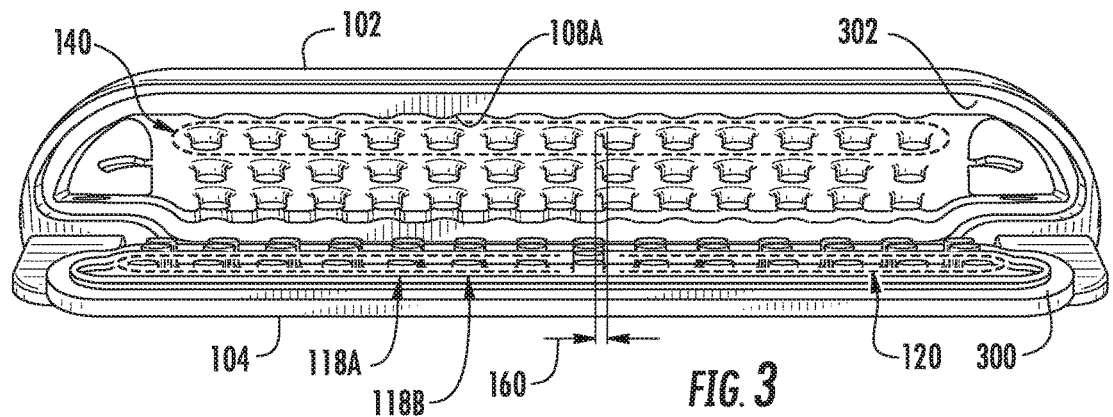
FIG. 3 shows an example of the body and the lid from FIG. 1 being assembled to form the heatsink.

FIG. 3 shows an example of the body 102 and the lid 104 from FIG. 1 being assembled to form the heatsink. The lid is currently at an angle relative to the body, and will be placed flat against the body in the assembly process. As shown in FIG. 3, the fins of row of fins 120 overlap the fins of row of fins 140 in the direction of the rows as indicated by reference number 160. Particularly, the lid has an edge 300 that corresponds to an edge 302 on the body, so as to allow the internal cavity to be formed and to be leak-resistant for the coolant.

Figure 4:
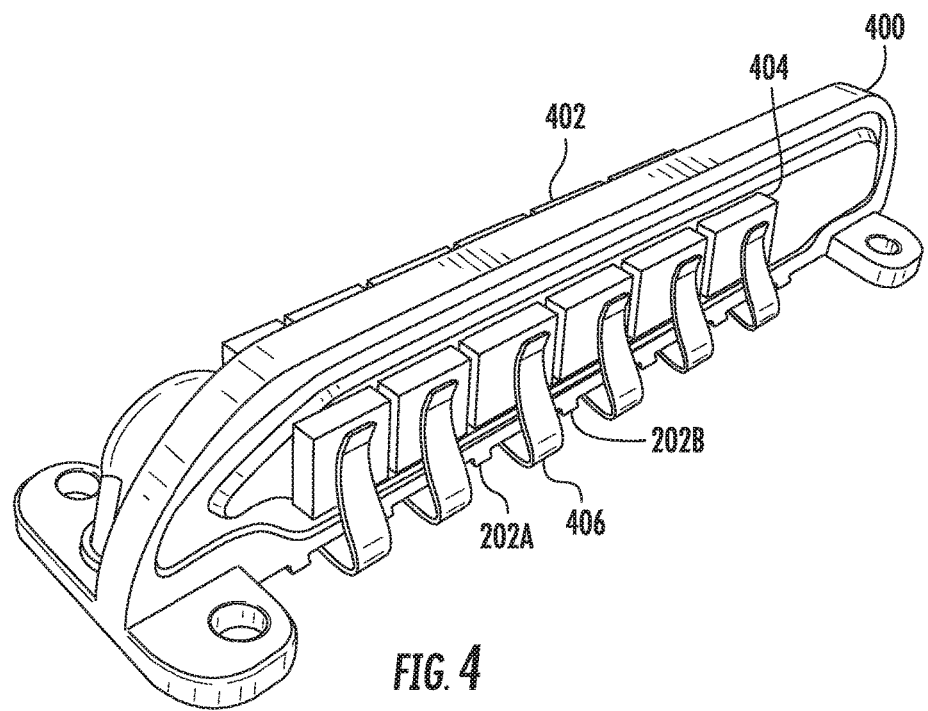
FIG. 4 shows an example of a heatsink having components attached by springs.

FIG. 4 shows an example of a heatsink 400 having components 402, 404 attached by springs 406. Here, each of the springs is in form of a clip that holds two components, one on each side of the heatsink. Tabs can be used for positioning of the springs. For example, tabs 202A and 202B here help position the spring 406 so as to resist displacement of the corresponding component(s) held by that spring. For simplicity, the components are here schematically shown. That is, pins, wiring or other connections have been omitted for clarity.

Figure 5:
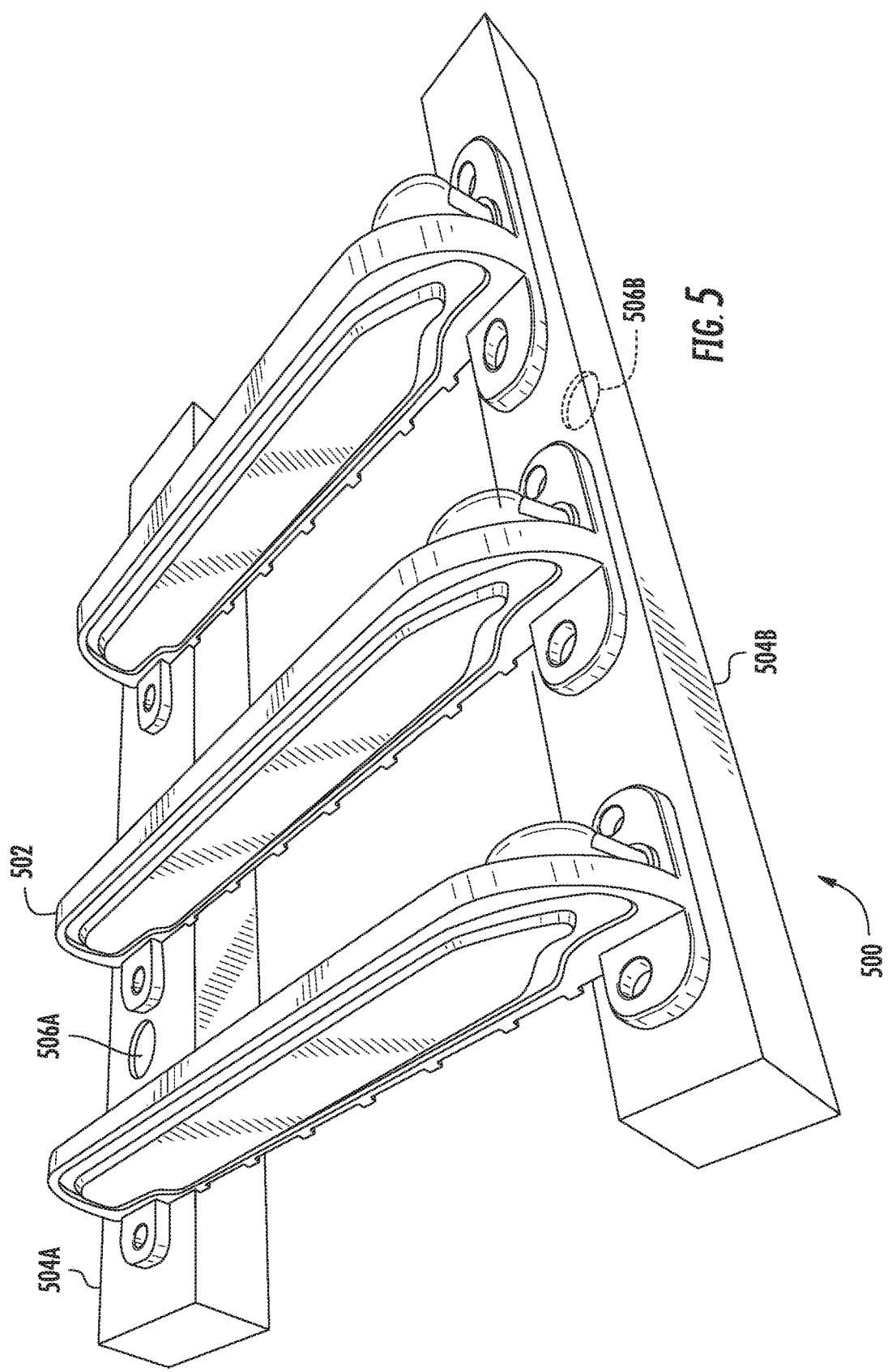
FIG. 5 shows an assembly of three heatsinks connected to manifolds.

FIG. 5 shows an assembly 500 of three heatsinks 502 connected to manifolds 504A-B. Each heatsink is attached so as to provide fluid connection between its inlet and one of the manifolds, and between its outlet and another of the manifolds. The manifolds have respective openings 506A-B to their respective hollow interiors. For example, coolant can be introduced into the manifold 504A so as to provide respective parallel coolant flows through the heatsinks 502, before exiting the manifold 504B through the opening 506B. The assembly 500 can be the only unit that is being cooled by a particular circulation of coolant, or the assembly can be one of multiple components or assemblies served by the coolant stream in its circulation.

Figure 6:
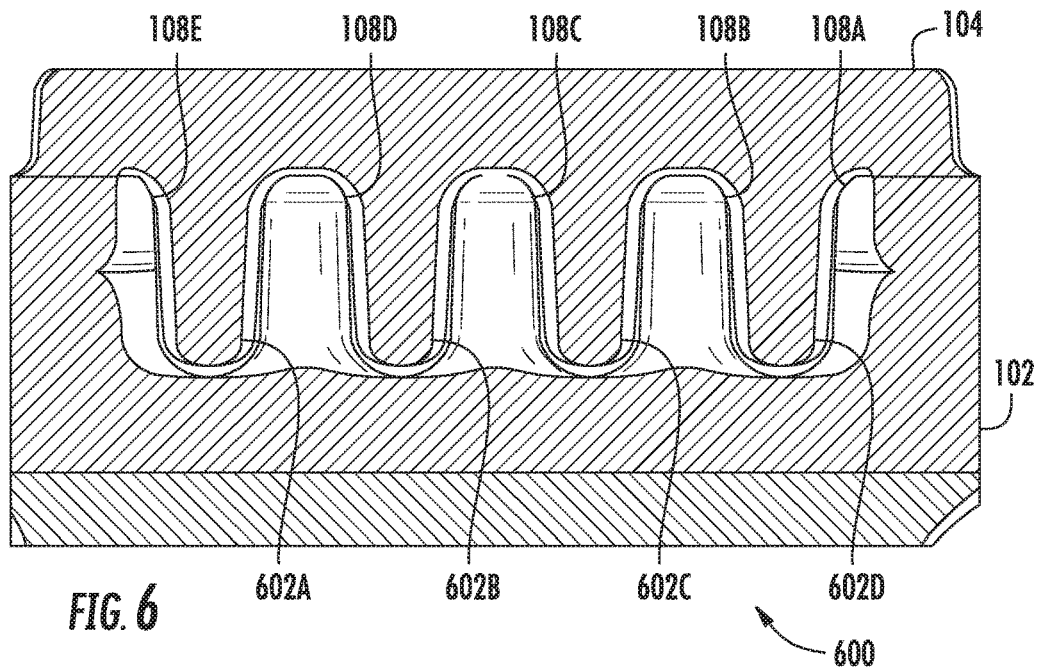
FIG. 6 shows an example cross section of the heatsink from FIG. 1 after assembly.

FIG. 6 shows an example cross section 600 of the heatsink from FIG. 1 after assembly. The body 102 and the lid 104 are here attached to each other so that the internal cavity is formed. The pins and half-pins are inside the internal cavity. Particularly, the complete pins 108B-D, as well as the half-pins 108A and 108E, are here visible. Similarly, fins 602A-D (on the lid in this example) are here visible in cross section. For example, the fins 602A-D can form the column 118A or B (FIG. 1). The fins 118A-E are here oppositely oriented than the fins 602A-D. Particularly, they are here oriented in opposite directions. Also, the amount of overlap between, on the one hand, the fins 118A-E, and on the other hand, the fins 602A-D can be chosen in the process of designing the parts of the heatsink. For example, there is here a full overlap between the fins 118A-E and 602A-D.

The fins 118A-E and 602A-D can have any suitable shape. In some implementations, the fins take the shape of pins extending from the respective body and lid. For example, the pins can include complete pins with an oval profile and half-pins that are corresponding half-ovals. The pin shape can depend on the flow condition. For example, a diamond shape or a round shape can work for a very low flow rate situation.

The fins 602A-D are offset with regard to the fins 118A-E. For example, the fins 602A-D may here be positioned deeper (in the viewing direction) than the fins 108A-E. This can provide an advantageous flow pattern for the coolant in the internal cavity. For example, a significant amount of turbulent flow can be achieved, which helps provide good thermal transfer from the fins (i.e., from the components attached to the heatsink) into the coolant. On the contrary, the fins 114, 116 (FIG. 1) can help avoid turbulent flow near the inlet and outlet. For example, having the flow in these regions be laminar rather than turbulent can help avoid an undesirable pressure drop in the coolant.

Figure 7:
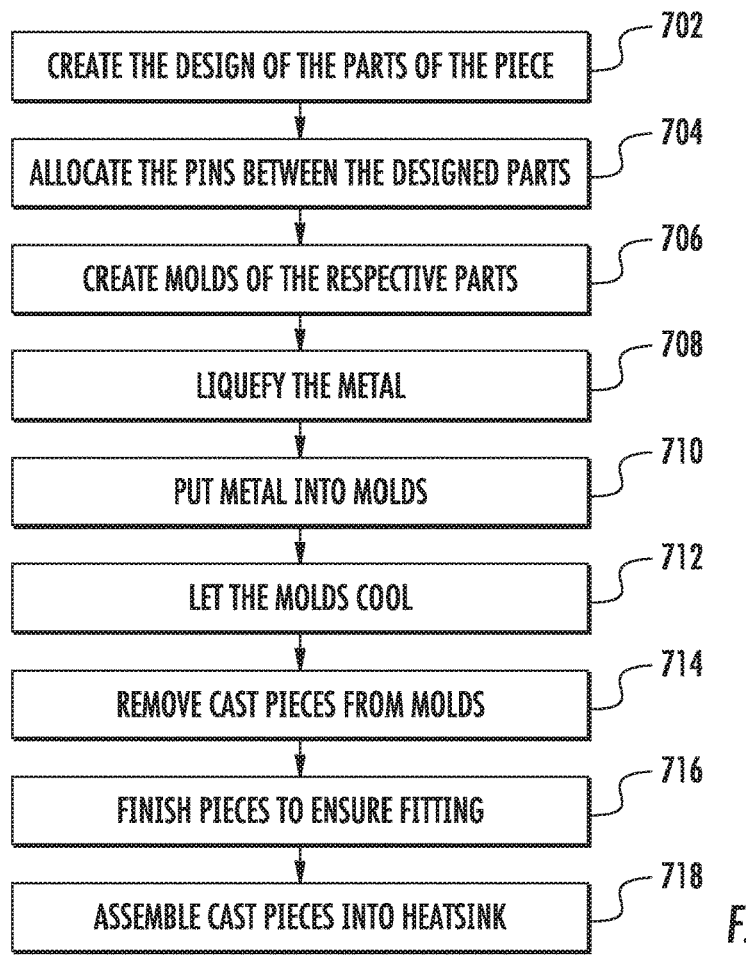
FIG. 7 shows an example of a process for manufacturing a heatsink.

FIG. 7 shows an example of a process 700 for manufacturing a heatsink. At 702, the respective parts of the device are designed. For example, one can define the shapes of the body and lid shown in FIG. 1, so that they will fit within an intended installation space, will physically accommodate the intended components that need cooling, and so that the heat-removing capacity of the heatsink is adequate for the intended use.

At 704, a number of fins (e.g., pins) are allocated between the designed parts. The pins can be arranged in respective arrays on the individual pieces. In some implementations, the pins can be allocated so that a column of pins on one of the pieces has N number of pins, and so that a corresponding column on another piece has the functional equivalent of N pins. For example, the other piece can have N−1 complete pins and two half-pins positioned at the ends of the column. This can allow a more equal heat flow from the respective pieces of the heatsink, for example when components are mounted on each side thereof. The design of the shapes will take into account any requirements of the manufacturing process. For example, when heatsink pieces are to be cast, each of the pins 108, 118 (FIG. 1) can be provided with a draft so that the cast piece can be removed from the mold.

At 706, molds for the respective parts can be created. For example, the molds can comprise the negative shapes corresponding to the body and lid shown in FIG. 1. The molds can be made from any suitable material, including, but not limited to, sand.

The molds can then be installed in a suitable manufacturing environment, such as in a factory. The process of casting pieces using the created molds can then be performed as many times as required, provided that molds may need refurbishing or replacement after a certain amount of use. At 708, a suitable metal can be liquefied. Any metal or alloy thereof suitable for casting can be used, including, but not limited to, aluminum. At 710, the liquefied metal is placed into the molds, for example by a gravity-feed process. The molds are allowed to cool at 712, which can involve passive cooling or actively controlling the temperature as it drops. The cast pieces are removed from the respective molds at 714, and finished at 716 as necessary to ensure a good fit.

At 718, the pieces can be assembled into a heatsink so as to form the internal cavity having the designed groups of pins. Any suitable attachment technique can be used, including, but not limited to, welding or brazing the pieces or applying an adhesive. One advantage of welding or brazing is that the two pieces become one, thermally. As a result, the final heatsink can be very balanced in terms of thermal mass on each side even if its two halves are very different sizes.

In the above example, the process 700 is directed toward manufacturing the heatsink by casting. This can provide some advantage, for example, that one can obtain essentially any desired separation between the respective fins in the internal cavity. By contrast, if the only fins in the internal cavity were those on either of the individual pieces, with no fins on the opposite piece, then the fin separation would be limited by the manufacturing process.

In other implementations, another manufacturing technique than casting can be used. For example, the individual pieces (e.g., the body and lid of FIG. 1) can be machined from any suitable material, including, but not limited to, aluminum.

Figure 8:
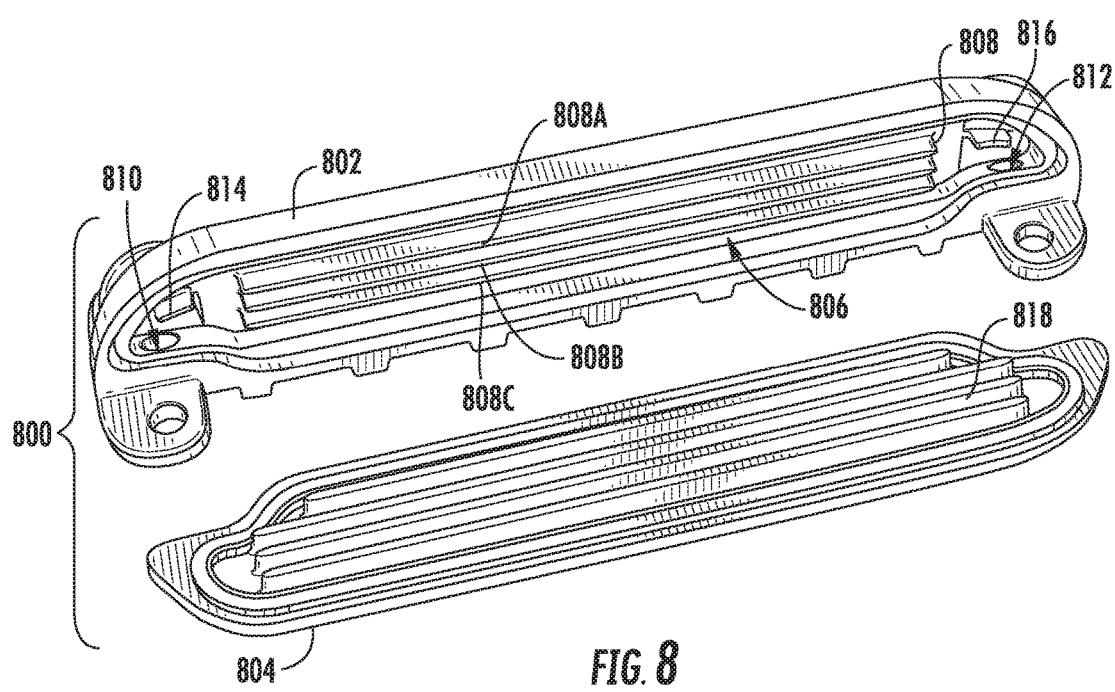
FIG. 8 shows another example of a heatsink that includes a body and a lid.

FIG. 8 shows another example of a heatsink 800 that includes a body 802 and a lid 804. The body has a hollow portion 806 that has a number of fins 808. The fins are arranged in a regular pattern, here in rows. Similar to the example in FIG. 1, the body 802 here also has an inlet 810 and an outlet 812, each of which has a corresponding fin 814 or 816.

The lid 804 has fins 818 that are configured in accordance with the fins 808 of the body 802. Similar to the fins of the body, the fins of the lid are arranged in a regular pattern, here in rows. The fins 818 are staggered so as to fit among the fins 808. For example, a particular one of the fins 818 is configured to fit between the fins 808A and 808B when the heatsink is assembled. Another one of the fins 818, in turn, is configured to fit between the fins 808B and 808C when the heatsink is assembled. The fins 808 and 818 are designed so that some space exists between them when assembled, thereby providing a passage for a coolant.

A number of implementations have been described as examples. Nevertheless, other implementations are covered by the following claims.

What is claimed is:

1. A heatsink comprising:
   a first part having first fins, the first fins arranged into a first plurality of rows and a first plurality of columns;
   a second part having second fins, the second fins arranged into a second plurality of rows and a second plurality of columns;
   wherein the first part and the second part form a hollow cavity therebetween when the first and second part are assembled;
   wherein, when the first part and the second part are assembled, the first fins extend into the hollow cavity from the first part and towards the second fins and the second fins extend into the hollow cavity from the second part and towars the first fins, the first fins overlapping the second fins in a direction in which the first fins extend towards the second fins;
   wherein the first plurality of rows are staggered from the second plurality of rows and the first plurality of columns are staggered from the second plurality of columns, when the first part and the second part are assembled;
   wherein an inlet for fluid and an outlet for fluid are disposed on a same side of the first part and the inlet and the outlet are disposed on opposing sides of the first fins in a direction parallel to the first plurality of rows such that fluid enters and exits the hollow cavity in a direction parallel to the first plurality of columns;
   an inlet fin arranged to direct fluid from the inlet to the first fins and the second fins, the inlet fin at least partially aligned with the inlet in a direction parallel to the first plurality of columns;
   an outlet fin arranged to direct fluid from the first fins and the second fins to the outlet, the outlet fin at least partially aligned with the outlet in a direction parallel to the first plurality of columns;
   a first mounting leg for directly coupling the inlet to a first manifold; and
   a second mounting leg for directly coupling the outlet to a second manifold.

2. The heatsink of claim 1, wherein the first fins and the second fins have an oval profile.

3. The heatsink of claim 1, wherein the inlet is directly attached to the first manifold via the first mounting leg and provides a first fluid connection between the first manifold and the hollow cavity and the outlet is directly attached to the second manifold via the second mounting leg and provides a second fluid connection between the second manifold and the hollow cavity.

4. The heatsink of claim 1, wherein the second plurality of columns have N number of fins and the first plurality of columns have N−1 number of fins, and wherein first plurality of columns further include respective half-fins.

5. The heatsink of claim 4, wherein the respective half-fins are disposed on top of, and below, the first plurality of columns, respectively.

6. The heatsink of claim 1, wherein the first part is a body of the heatsink and the second part is a lid of the heatsink.

7. The heatsink of claim 1, further comprising a plurality of tabs on the first part.

8. The heatsink of claim 7, further comprising a spring between the plurality of tabs, wherein the spring is operable to hold a first electric component to the first part and a second electric component to the second part.

9. An apparatus comprising:
   a first heatsink including:
      a first part having first fins, the first fins arranged into a first plurality of rows and a first plurality of columns;

a second part having second fins, the second fins arranged into a second plurality of rows and a second plurality of columns;

wherein the first part and the second part form a first hollow cavity therebetween when the first and second part are assembled;

wherein, when the first part and the second part are assembled, the first fins extend into the first hollow cavity from the first part and towards the second fins and the second fins extend into the first hollow cavity from the second part and towards the first fins, the first fins overlapping the second fins in a direction in which the first fins extend towards the second fins;

wherein the first plurality of rows are staggered from the second plurality of rows and the first plurality of columns are staggered from the second plurality of columns, when the first part and the second part are assembled;

wherein a first inlet for fluid and a first outlet for fluid are disposed on a same side of the first part and the inlet and the outlet are disposed on opposing sides of the first fins in a first direction parallel to the first plurality of rows such that fluid enters and exits the hollow cavity in a direction parallel to the first plurality of columns;

a first inlet fin arranged to direct fluid from the first inlet to the first fins and the second fins, the first inlet fin at least partially aligned with the first inlet in a direction parallel to the first plurality of columns; and a first outlet fin arranged to direct fluid from the first fins and the second fins to the first outlet in a manner that reduces turbulence of the fluid, the first outlet fin at least partially aligned with the first outlet in a direction parallel to the first plurality of columns;

a first mounting leg for directly coupling the first inlet to a first manifold;

a second mounting leg for directly coupling the first outlet to a second manifold; and a second heatsink including:

a third part having third fins, the third fins arranged into a third plurality of rows and a third plurality of columns;

a fourth part having fourth fins, the fourth fins arranged into a fourth plurality of rows and a fourth plurality of columns;

wherein the third part and the fourth part form a second hollow cavity therebetween when the third and fourth part are assembled;

wherein, when the third part and the fourth part are assembled, the third fins extend into the second hollow cavity from the third part and towards the fourth fins and the fourth fins extend into the second hollow cavity from the fourth part and towards the third fins, the third fins overlapping the fourth fins in a direction in which the third fins extend towards the fourth fins;

wherein the third plurality of rows are staggered from the fourth plurality of rows and the third plurality of columns are staggered from the fourth plurality of columns, when the third part and the fourth part are assembled;

wherein a second inlet for fluid and a second outlet for fluid are disposed on a same side of the third part and the second inlet and the second outlet are disposed on opposing sides of the third fins in a second direction parallel to the third plurality of rows;

a second inlet fin arranged to direct fluid from the second inlet to the third fins and the fourth fins, the second inlet fin at least partially aligned with the second inlet in a direction parallel to the third plurality of columns;

a second outlet fin is arranged to direct fluid from the third fins and the fourth fins to the second outlet in a manner that reduces turbulence of the fluid, the second outlet fin at least partially aligned with the second outlet in a direction parallel to the third plurality of columns;

a third mounting leg for directly coupling the first inlet to the first manifold; and a fourth mounting leg for directly coupling the first outlet to the second manifold.

10. The apparatus of claim 9, wherein the first fins, the second fins, the third fins and the fourth fins have an oval profile.

11. The apparatus of claim 9, wherein:

the first inlet is directly attached to the first manifold via the first mounting leg and provides a first fluid connection between the first manifold and the first hollow cavity;

the second inlet is directly attached to the first manifold via the third mounting leg and provides a second fluid connection between the first manifold and the second hollow cavity;

the first outlet is directly attached to the second manifold via the second mounting leg and provides a third fluid connection between the second manifold and the first hollow cavity; and the second outlet is directly attached to the second manifold via the third mounting leg and provides a fourth fluid connection between the second manifold and the second hollow cavity.

12. The apparatus of claim 9, wherein the second plurality of columns and the fourth plurality of columns have N number of fins and the first plurality of columns and the third plurality of columns have N−1 number of fins, and wherein the first plurality of columns and the third plurality of columns further include respective half-fins.

13. The apparatus of claim 12, wherein the respective half-fins are disposed on top of, and below, the first plurality of columns and the third plurality of columns, respectively.

14. The apparatus of claim 9, wherein:

the first part is a first body of the first heatsink;

the second part is a first lid of the first heatsink;

the third part is a second body of the second heatsink; and the fourth part is a second lid of the second heatsink.

15. The apparatus of claim 9, further comprising a plurality of tabs on the first part and the third part.

16. The apparatus of claim 15, further comprising springs between the plurality of tabs, wherein the springs are operable to hold a first electric components to the first part and a second electric component to the second part.

* * * * *